United States Patent
Davis et al.

(10) Patent No.: US 9,875,810 B2
(45) Date of Patent: Jan. 23, 2018

(54) SELF-IDENTIFYING MEMORY ERRORS

(71) Applicant: Microsoft Corporation, Redmond, WA (US)

(72) Inventors: John D. Davis, San Francisco, CA (US); Karin Strauss, Seattle, WA (US); Mark Steven Manasse, San Francisco, CA (US); Parikshit S. Gopalan, Mountain View, CA (US); Sergey Yekhanin, Mountain View, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 231 days.

(21) Appl. No.: 13/949,227

(22) Filed: Jul. 24, 2013

(65) Prior Publication Data

US 2015/0033064 A1    Jan. 29, 2015

(51) Int. Cl.
*G11C 29/00* (2006.01)
*G11C 29/44* (2006.01)
(Continued)

(52) U.S. Cl.
CPC ...... *G11C 29/4401* (2013.01); *G11C 13/0064* (2013.01); *G11C 16/3404* (2013.01);
(Continued)

(58) Field of Classification Search
CPC ..... G11C 29/44; G11C 29/4401; G11C 29/52; G11C 29/783; G11C 29/72;
(Continued)

(56) References Cited

U.S. PATENT DOCUMENTS 5,748,543 A * 5/1998 Lee ............... G11C 29/785
 365/200
6,065,141 A * 5/2000 Kitagawa ........... G11C 29/4401
 714/6.2
(Continued)

FOREIGN PATENT DOCUMENTS

WO    2006105133 A1    10/2006

OTHER PUBLICATIONS

Seongy, et al., "SAFER: Stuck-At-Fault Error Recovery for Memories", Retrieved at <<http://ieeexplore.ieee.org/stamp/stamp.jsp?tp=&arnumber=5695530>>, In 43rd Annual IEEE/ACM International Symposium on Microarchitecture, Dec. 4, 2013, pp. 10.
(Continued)

*Primary Examiner* — Albert Decady
*Assistant Examiner* — Osman M Alshack
(74) *Attorney, Agent, or Firm* — Talem IP Law, LLP

(57) ABSTRACT

A memory region can durably self-identify as being faulty when read. Information that would have been assigned to the faulty memory region can be assigned to another of that sized region in memory using a replacement encoding technique. For phase change memory, at least two fault states can be provided for durably self-identifying a faulty memory region; one state at a highest resistance range and the other state at a lowest resistance range. Replacement cells can be used to shift or assign data when a self-identifying memory fault is present. A memory controller and memory module, alone or in combination may manage replacement cell use and facilitate driving a newly discovered faulty cell to a fault state if the faulty cell is not already at the fault state.

18 Claims, 8 Drawing Sheets

(51) Int. Cl.
*G11C 16/34* (2006.01)
*G11C 29/52* (2006.01)
*G11C 13/00* (2006.01)
*G11C 29/04* (2006.01)

(52) U.S. Cl.
CPC ........ *G11C 16/349* (2013.01); *G11C 16/3454* (2013.01); *G11C 29/52* (2013.01); *G11C 13/0033* (2013.01); *G11C 13/0035* (2013.01); *G11C 2029/0409* (2013.01)

(58) Field of Classification Search
CPC ............ G11C 13/0064; G11C 13/0033; G11C 13/0035; G11C 16/3454; G11C 16/349; G11C 16/3404; G11C 2029/0409; G11B 20/1833; G11B 20/1896
USPC .................. 714/710, 752, 763, 52, 723, 718
See application file for complete search history.

(56) References Cited

U.S. PATENT DOCUMENTS

| | | | | |
|---|---|---|---|---|
| 6,094,385 | A * | 7/2000 | Trimberger | G11C 29/848 326/12 |
| 6,373,758 | B1 * | 4/2002 | Hughes | G11C 29/44 365/200 |
| 6,404,680 | B1 | 6/2002 | Kwon | |
| 6,584,589 | B1 * | 6/2003 | Tran | G11C 29/50 365/201 |
| 6,631,086 | B1 * | 10/2003 | Bill | G11C 29/72 365/185.09 |
| 7,127,647 | B1 * | 10/2006 | Zorian | G11C 29/16 714/711 |
| 7,203,874 | B2 | 4/2007 | Roohparvar | |
| 7,536,614 | B1 * | 5/2009 | Ma | G11C 29/44 365/200 |
| 7,609,083 | B2 * | 10/2009 | Fuseya | G06F 11/142 326/10 |
| 7,626,874 | B1 * | 12/2009 | Fan | G11C 29/44 365/185.09 |
| 2002/0136054 | A1 * | 9/2002 | Blodgett | G11C 11/56 365/185.03 |
| 2003/0235092 | A1 * | 12/2003 | Micheloni | G11C 29/808 365/200 |
| 2004/0190357 | A1 * | 9/2004 | Scheuerlein | G11C 7/1006 365/222 |
| 2005/0055173 | A1 * | 3/2005 | Eustis | G11C 29/44 702/118 |
| 2006/0239089 | A1 * | 10/2006 | Kawamoto | G06F 11/1068 365/200 |
| 2008/0209282 | A1 * | 8/2008 | Lee | G11C 11/5621 714/54 |
| 2009/0199057 | A1 * | 8/2009 | Al-Harbi | G11C 29/10 714/718 |
| 2009/0268521 | A1 | 10/2009 | Ueno et al. | |
| 2010/0011260 | A1 * | 1/2010 | Nagadomi | G06F 11/008 714/704 |
| 2010/0046292 | A1 * | 2/2010 | Hahn | G11C 29/76 365/185.09 |
| 2010/0238721 | A1 | 9/2010 | Wang et al. | |
| 2011/0090751 | A1 * | 4/2011 | Manna | G11C 29/4401 365/200 |
| 2011/0296258 | A1 | 12/2011 | Schechter et al. | |
| 2012/0106247 | A1 | 5/2012 | Shin | |
| 2013/0013977 | A1 | 1/2013 | Rivers et al. | |
| 2013/0173970 | A1 * | 7/2013 | Kleveland | G11C 29/44 714/710 |

OTHER PUBLICATIONS

Li, et al., "March-based RAM diagnosis algorithms for stuck-at and coupling faults", Retrieved at <<http://ieeexplore.ieee.org/stamp/stamp.jsp?tp=&arnumber=966697>>, In Proceedings of International Test Conference, Nov. 2001, pp. 10.

Schechter, et al., "Use ECP, not ECC, for Hard Failures in Resistive Memories", Retrieved at <<http://www.sony.com.au/microsite/hmd/index.html#overview/comfort>>, in ACM IEEE International Symposium on Computer Architecture, Jun. 23, 2010, pp. 12.

Melhem, et al., "RDIS: A Recursively Defined Invertible Set Scheme to Tolerate Multiple Stuck-At Faults in Resistive Memory", Retrieved at <<http://ieeexplore.ieee.org/stamp/stamp.jsp?tp=&arnumber=6263949>>, In 42nd Annual IEEE/IFIP International Conference on Dependable Systems and Networks, Sep. 28, 2012, pp. 12.

Yoon, et al., "FREE-p: Protecting non-volatile memory against both hard and soft errors", Retrieved at <<http://ieeexplore.ieee.org/stamp/stamp.jsp?tp=&arnumber=5749752>>, IEEE 17th International Symposium on High Performance Computer Architecture, Feb. 12, 2011, pp. 12.

Yeo, et al., "Can Multi-Level Cell PCM Be Reliable and Usable? Analyzing the Impact of Resistance Drift", Retrieved at <<http://arch.ece.gatech.edu/pub/wddd12.pdf>>, In the 10th Annual Workshop on Duplicating, Deconstructing and Debunking in Conjunction with the 39th International Symposium on Computer Architecture, Jun. 2012, pp. 5.

International Search Report and Written Opinion Issued in PCT Patent Application No. PCT/US2014/047345, Mailed Date: May 8, 2015, 20 Pages.

"International Preliminary Report on Patentability Issued in PCT Application No. PCT/US2014/047345", Mailed Date: Dec. 22, 2015, 11 Pages.

"Second Written Opinion Issued in PCT Application No. PCT/US2014/047345", Mailed Date: Sep. 17, 2015, 9 Pages.

* cited by examiner

SELF-IDENTIFYING MEMORY ERRORS

BACKGROUND

Memory wear-out, permanent errors generating "stuck-at" bits, and transient errors from bits that inappropriately flip states can plague memory devices. Error detection and error correction schemes may be incorporated in computing systems at various levels to insulate software and data stored on memory devices from experiencing soft and hard errors occurring at the physical memory. Soft errors refer to correctable errors, for example those errors that may be corrected by re-writing the data. Hard errors refer to permanent errors, for example those errors that may be due to a physical defect or other anomaly that corrupt bits in a repeatable manner. Sometimes when a block of memory has multiple soft errors, the memory block may be considered to have a hard error.

For certain memories that wear out, hard errors are typically detected during write operations, often via read-after-write, assuming non-destructive data. Because it is useful to know the location where a hard error occurs, some solutions for error correction involve recording information about the location of the faults in another memory location. However, if no information about the location of the faults is recorded during the write operation or a memory failure occurs at the location storing the information about the location of the faults, this information is lost. Thus, during a subsequent read or write operation, the faulty cells may not be identified.

BRIEF SUMMARY

Memory having durable self-identifying faults and memory cell replacement techniques for steering around a cell self-identified as having a fault are described.

A memory cell can indicate that the memory is faulty and, using a replacement encoding technique, information that would have been assigned to the faulty memory can be assigned to another of that sized region in memory. Single cell fault identification and replacement can be carried out.

Once a memory cell is self-identified as containing a fault, corrective approaches may be carried out at different levels of granularity. A block of replacement cells may be available for storing data as a memory cell becomes self-identified as being a faulty cell. In some cases, a cluster of cells may be replaced; or a faulty cell is replaced one cell at a time. The number of cells in a replacement block may vary. In some cases, a hierarchy of replacement blocks is available.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

DETAILED DESCRIPTION

Figure 1:
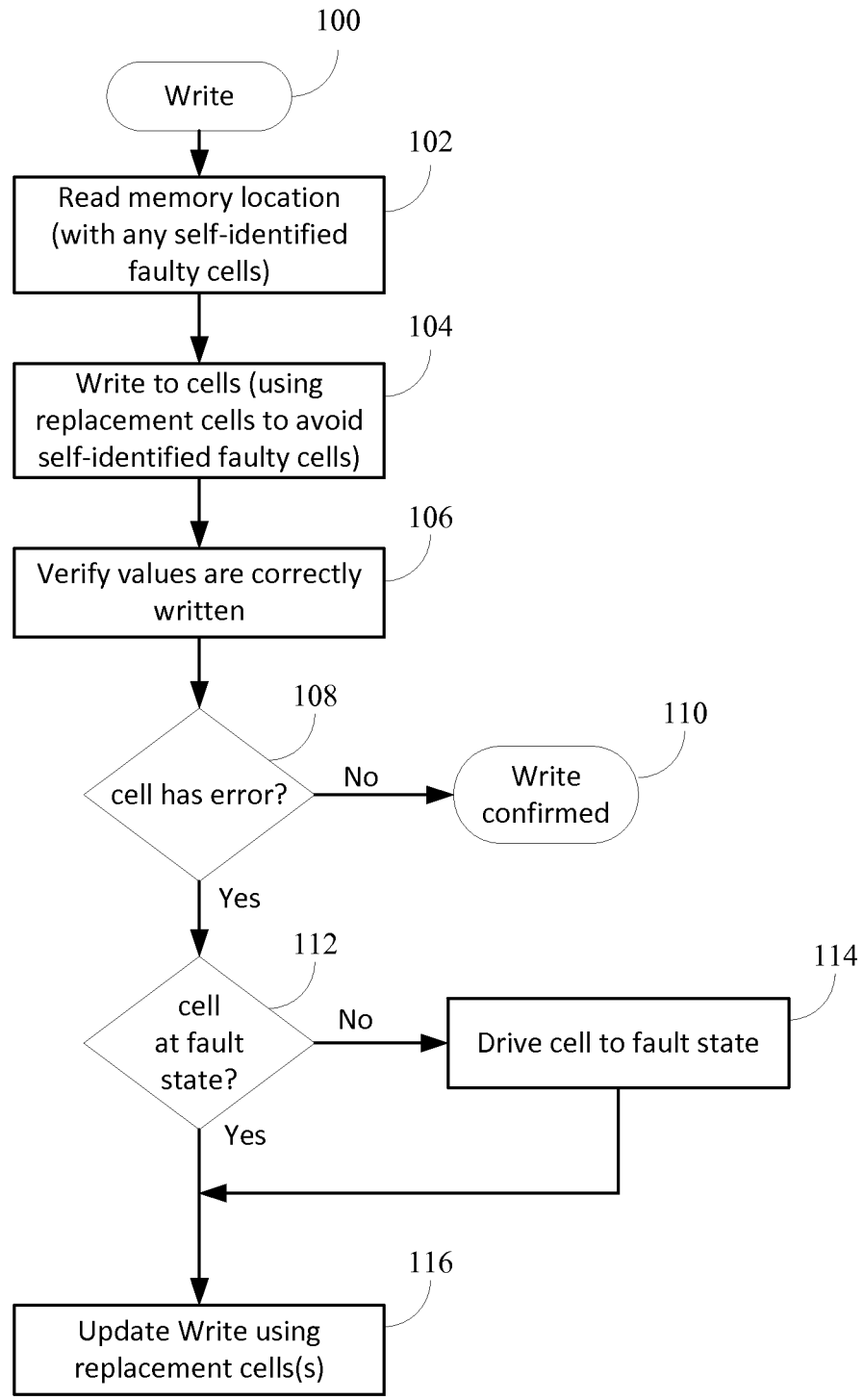
FIG. 1 illustrates a write process according to an implementation.

Memory having durable self-identifying faults and memory cell replacement techniques for steering around a cell self-identified as having a fault are described.

A durable self-identifying fault refers to a physical property of a memory unit (such as a cell) that indicates, upon inspection of the memory unit, that the memory unit is faulty. The fault may be a "permanent" fault such as described in the Background. The durability of the self-identifying physical property refers to the ability of the indication of a faulty state to persist in that state when read or accessed. The state can be considered durable where the state may drift outside of a suitable range and refreshing (or driving to a particular value) is performed to maintain the state. In addition, the state can be considered durable if some re-writing is performed to maintain the state. Thus the durability is directed to the expectation that when the memory unit is accessed for reading, writing, or performing some other process, the memory unit self-identifies as being a faulty memory unit.

The self-identifying nature of the physical property refers to the use of a differentiable indicator for distinguishing between a valid memory unit and an invalid memory unit. The differentiable indicator may be, for example, the state in which the memory unit may be driven or broken that is outside of values (resistance or charge) defined for valid states. In some cases, the self-identifying state involves allowing the memory device to remain at values above or below outer boundaries of valid states (e.g., those states indicative of a 0 or 1 during normal operations of the memory unit). In some cases, the self-identifying state involves driving the memory device to values above or below outer boundaries of valid states.

The value indicating the failure state may be imposed by a memory module, memory controller or some other component coupled to the memory cell depending on the implementation.

A memory cell refers to an addressable unit of memory and includes a structure configured to store information as a state, usually in the form of a charge (e.g., DRAM, Flash) or resistance (e.g., memristor, PRAM). Information is written to and read from a memory cell under the control of programming and/or sensing circuitry, which may operate under the guidance of a memory controller coupled to a memory device of a memory module or individual chip containing the memory cell as part of an array of memory cells. The memory module (or individual chip) and memory controller may be combined in a memory system and may be provided on a same chip or board. In some cases, aspects of the memory controller may be handled by a processor of a computing device in which the memory system forms a part.

One approach to minimizing data errors due to an inoperable or faulty cell is to avoid writing data into the cell. This is facilitated where a cell can self-identify that it contains a fault. Avoidance of the faulty cell may be carried out by discarding a cluster or block of memory cells in which the inoperable cell is located or by avoiding the faulty memory cells on a per-cell basis. A cluster of memory cells refers to a grouping of memory cells situated in proximity on a chip. In some cases, a self-identification of a faulty cell may be applied or carried out by the cluster or block (so that the cluster or block stand or fall together when an error is detected). Replacement cells can be used to store data intended for a faulty cell (or block of cells).

Certain implementations are suitable for handling memory cells with stuck-at-faults, where a logic value of a cell remains unchanged (e.g., at 0 or 1 for single level cells), as well as other non-transient faults. The physical properties of memory cells themselves are used to record (i.e., encode) the information that the cell is unusable.

The self-identification of a fault may be used where multiple states are available for a memory. The multiple states include valid states and at least one state indicating a failure mode achieved through a break, a fuse or other structural or mechanical change. In some cases, there may be at least three available value ranges; and a single state is reserved to designate a broken or otherwise faulty state. In some cases, there may be at least four available value ranges, where two states that are not usually encoded are reserved to indicate a fault. According to various implementations, as un-writable cell locations are discovered the cells may be allowed to remain at a state indicating a fault or driven to a state indicating a fault. The remainder of the cells can be written to using normal encoding (e.g., values indicating 0 and 1).

A cell may store a single bit or multiple bits. Thus the size of a data unit depends on the particular technology for the cell (e.g., a single level cell stores a single bit and a multi-level cell stores more than one bit).

By encoding the highest and/or lowest values available to a memory cell, information on the write-ability of the cell based on a past discovered error is available. Indeed, it may be possible to identify which memory cells have stuck-at locations on a read operation—and not only immediately following a write operation.

A self-identified memory cell as described herein is suitable for memories in which a read, write, verify process is carried out when writing. In particular, as part of a write-verify process, the cells being written to can be read to verify that the cells have the appropriate values written to them.

The write-verify process can be used when writing to memory with durable self-identifying faults. Thus, during a write process, whether data has been written correctly to a location can be verified. Multiple write-verify processes may be applied before a cell is deemed faulty. If a cell at the location where the data has been written does not have the correct value, that cell can be self-identified as a fault and the data for that cell (or region of cells, depending on granularity) can be written to another cell.

FIG. 1 illustrates a write process according to an implementation. Referring to FIG. 1, a write process (100) can include reading (102) a memory location of an addressed received by a program. While reading (102), the values of the cells at a memory location, faulty cells may self-identify. Updated information can be written (104) to the cells according to a cell replacement function (e.g., a managing function associated with the replacement cells and controlling user thereof) when there are faulty cells in a block of memory. After writing to the cells (104), the values are verified (106) to determine whether the values in the cells are valid and match the information written. If there are no cells having a hard error (108) (or other failure state), the write is confirmed (110). Because a write error may be transient, an iterative process where the write may be attempted multiple times before the cell is deemed to have a hard error can be part of the verification process.

On the other hand, in response to the verification process determining a cell value does not match the write request (i.e., the verification process indicates that a cell has a hard error) (108), a determination can be made as to whether the value for the cell is within the range of a fault state (112). In some implementations, an iterative process of tentative writes may be carried out by the verification process in order to determine that a cell is faulty. In one such implementation, a cell can be deemed to be faulty after a certain number of tentative writes with an incorrect result exceeds a threshold. Once a cell is deemed to be faulty and if the cell is not within the range of the fault state (112), then the cell can be driven to a fault state (114). For example, the value in the cell may be within or slightly above the range indicating a 0 (but not within the range to indicate a 1 state) when writing a 1 to the cell. In this case (e.g., stuck at 0), the cell can be driven (114) to a fault state in a range below the valid 0 state. If the cell is at a fault state (112), the write may be updated using replacement cell(s) (116).

Figure 2:
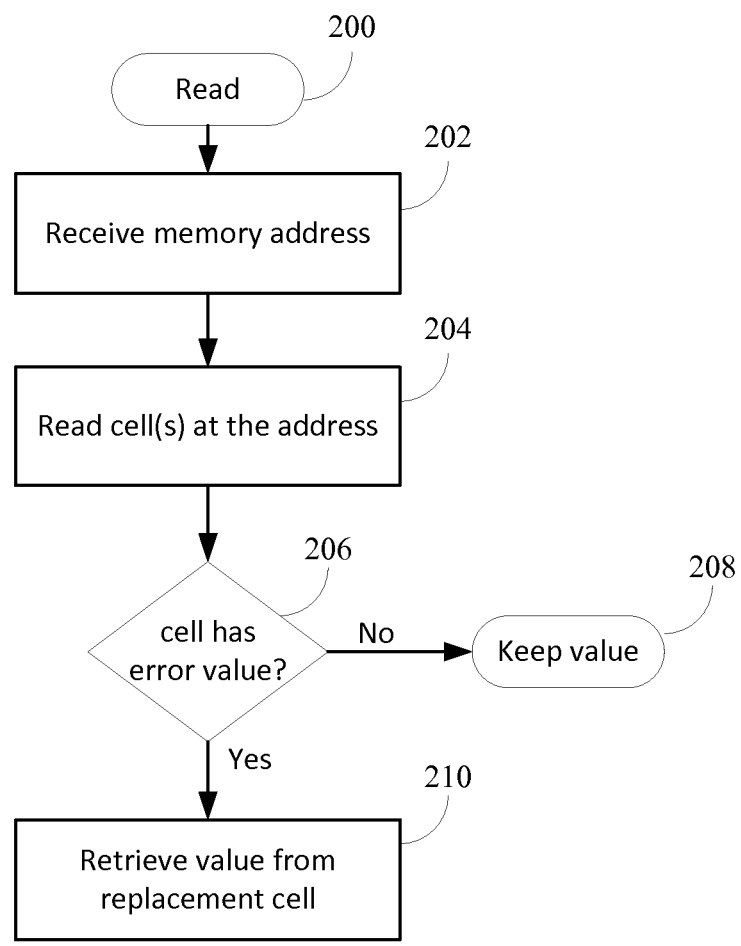
FIG. 2 illustrates a read process according to an implementation.

FIG. 2 illustrates a read process according to an implementation. Referring to FIG. 2, a read process (200) may begin upon receiving a memory address location to read (202). The read process (200) may be carried out as part of a read-write-verify process; or be performed as a direct read. Cells at the address are read (204) and the values of the cells are examined. If the values of the cell(s) are within normal ranges (206), the value is retained (208), indicating the state for that cell. Otherwise, values may be retrieved from a replacement cell or some other cell in the block, and possibly reordered according to the cell replacement function of the memory block (210).

As an example, for a read-write-verify process, the data in the cells may optionally initially be read in order to compare the values of the currently stored data with those to be written. Such a step can be used to reduce redundant writing of bits. The reading may also optionally be carried out with respect to the spare cells to determine if any of the spare cells are faulty before attempting to write to the spare cells. In some cases, the read can be performed both to determine whether a reduction in redundancy can be taken and whether there are faulty replacement cells. When the read is performed for these reasons, the cell replacement function does not need to be called because the data is not required to be reassembled at this time. Instead, data is obtained from the replacement cells to support a subsequent step of writing into the replacement cells (and facilitate faster write-processes).

As another example, for a read process, the data in the cells of the memory block and replacement cells are returned in the originally stored sequence. When the process is carried out by a memory controller, the memory controller can reorder and/or reassemble data stored in the replacement cells according to the cell replacement function. Thus, when the data is provided to an application or other program module requesting the read, the data can be provided in the appropriate form regardless of how it is stored.

A memory device configuration according to certain implementations involves additional spare cells that are added to a memory block; when one of the original cells in the block gets stuck (for example, due to write wear or some other permanent or durable failure), the error is detectable on subsequent reads; and a spare cell is used to replace the worn cell without the need to address the worn cell. In some cases, rotating wear leveling is used to distribute the wear of the cells in the memory blocks.

Management of replacement cells may be accomplished using a number of techniques. Some non-limiting examples of implementing replacement cells are presented below and illustrated in FIGS. 3A-3E. Each replacement cell configuration may include an associated managing function that controls use of the replacement cell block.

Figure 3A:
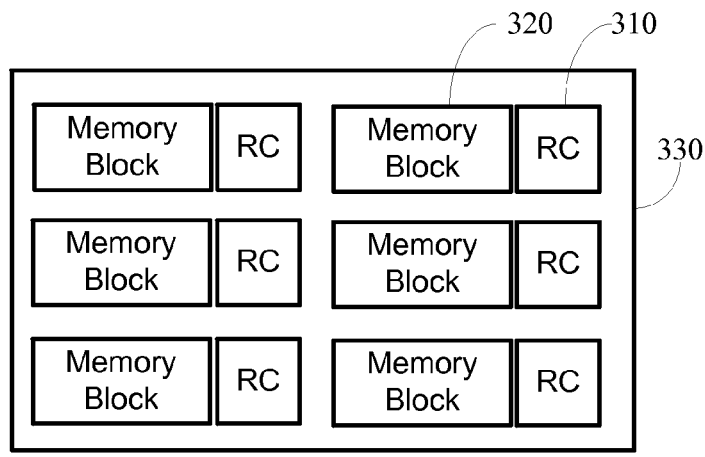
FIGS. 3A-3E illustrate example replacement cell configurations.
Figure 3B:
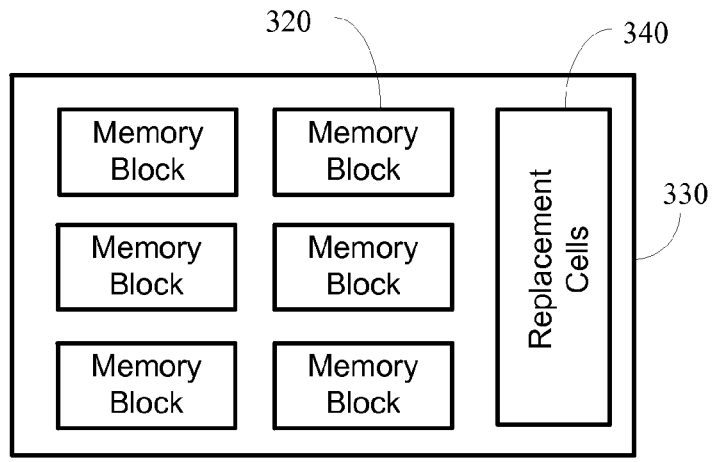

In one implementation, such as shown in FIG. 3A, the spare cells (replacement cells (RC) 310) are provided adjacent each memory block 320 in physical memory 330. For example, the replacement cells 310 may be located in consecutive cells from the memory block 320. As a cell in a memory block 320 gets worn out or is faulty, a replacement function is used to allocate the information stored in the memory block 320 in the valid cells with the replacement cells 310 used to maintain the same number of bits for the memory block 320.

In another implementation the spare cells 340 are provided as part of a region of the memory 330 set aside for spare cells. In some implementations certain subsets of the spare cells 340 are allocated for each memory block. In some implementations, the region set aside for spare cells 340 may be shared by multiple memory blocks and allocated as needed.

For example, a memory block 320 may be associated with a pool of replacement cells 340 that is associated with a number of blocks for added flexibility. The replacement cells may be used according to a replacement function. The replacement function can be a mapping function. Logic can be included to perform a look-up to determine where the new cell is located. In various implementations, the logic and/or mapping may be implemented in hardware or software.

Figure 3C:
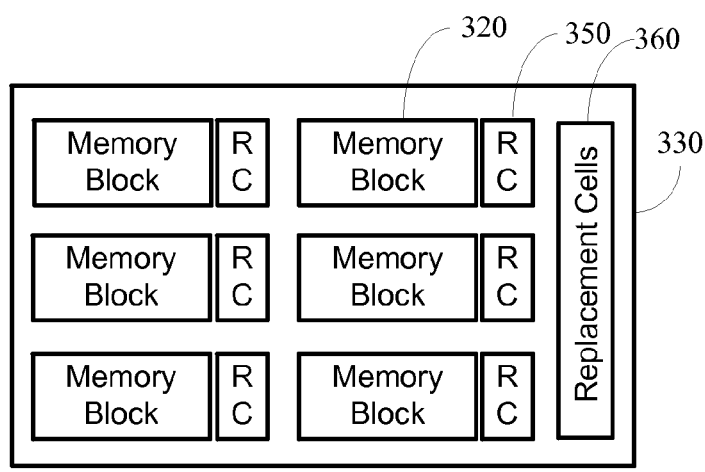
Figure 3D:
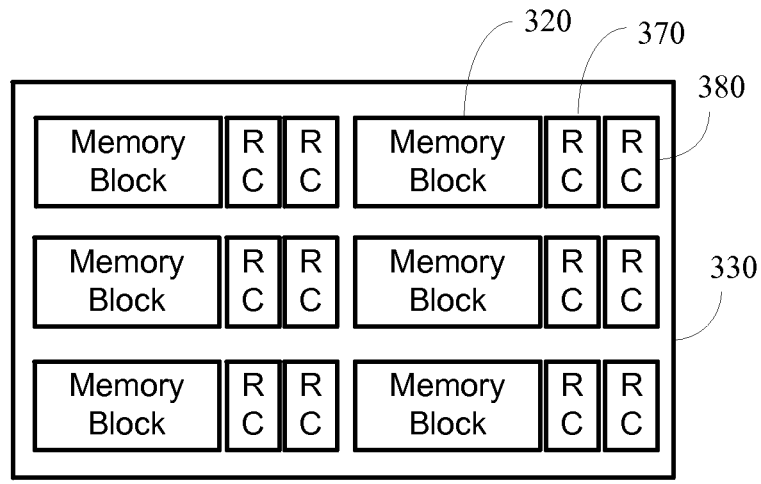

A hierarchy of approaches may also be used. For example, a first number of replacement cells may be local. Then, once the local cells are at capacity (being used) a different mapping may be used to assign data to a replacement cell. FIGS. 3C and 3D illustrate two examples of a hierarchy approach.

In one implementation, such as shown in FIG. 3C, some spare cells 350 are provided adjacent the memory block 320 and additional spare cells 360 are located at a region set aside for spare cells. In some cases, the set aside region of spare cells 360 may be available for sharing among multiple memory blocks.

In another implementation, such as shown in FIG. 3D, the spare cells for a memory block are provided adjacent to each memory block similar to that described with respect to FIG. 3A. However, instead of a single replacement function for allocating information for the memory block, two or more replacement functions can be used, for example, a first replacement function for a certain number of replacement cells 370 consecutively arranged adjacent the memory block 320, and a second replacement function for the remaining replacement cells 380. As one example, the first replacement function may be a shifting function while the second replacement function may perform faulty cell replacement.

Figure 3E:
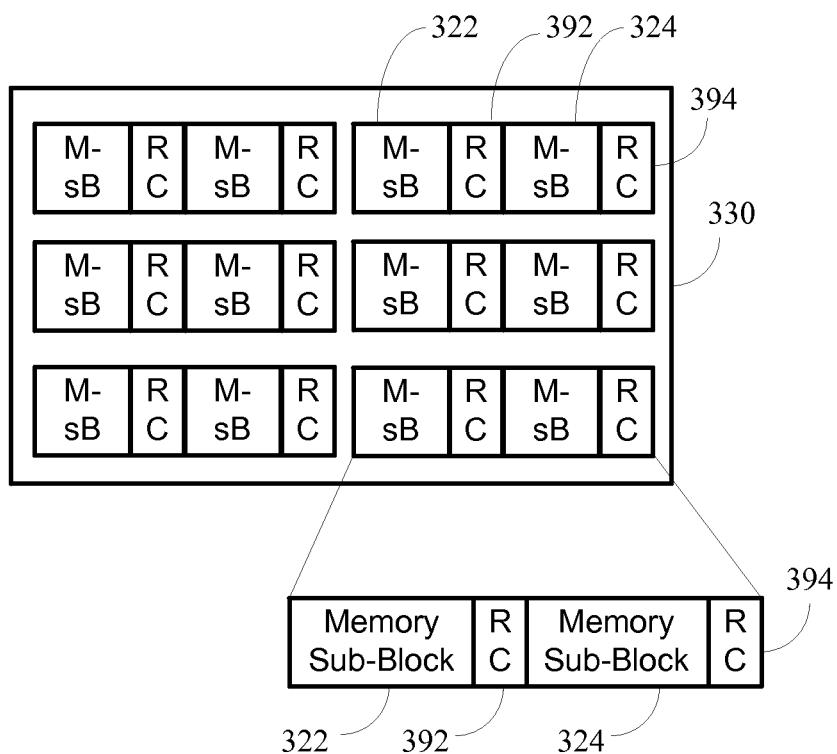

Another implementation is shown in FIG. 3E. In the implementation illustrated in FIG. 3E, replacement cells are distributed in the memory block itself. For example, a memory block can be split into memory sub-blocks 322, 324; and replacement cells 392, 394 can be arranged between (and outside) the memory sub-blocks 322, 324. The number of the sub-blocks and the size of each sub-block may be any suitable number and size for a particular application or technology.

Although two memory sub-blocks and two replacement cell sub-blocks are shown for simplicity, embodiments are not limited thereto. For example, one replacement cell block may be used between two memory sub-blocks, or three replacement cell sub-blocks may be arranged at both sides and between the two memory sub-blocks. In some cases, the replacement cell sub-blocks may be distributed in more locations within the memory block, resulting in 3 or more memory sub-blocks in the memory block. In some cases, the memory block is divided in a manner that there are at least two different sized sub-blocks while in other cases, the sub-blocks are the same size. In addition, the replacement cell sub-blocks may be distributed in equal sized sub-blocks or at least two sizes for the sub-blocks are used.

For implementations involving a shifting cell replacement function, distributing the replacement cell block(s) within a memory block can reduce the number of cells that need to be shifted. For example, if a memory block is 512 bits and the replacement cells are 64 bits, 8 memory sub-blocks of 64 bits with 8 bits of replacement cells for either left shifting or right shifting can be arranged. Shifting can still be carried out over the full 512 bits of the memory block and 64 bits of replacement cells. For example, if one of the memory sub-blocks has more than 8 bits self-identify as faulty, shifting can occur into the adjacent sub-memory block, resulting in shifting 63 bits at most instead of 511.

FIGS. 4A-4D illustrate one technique for writing to a location having one or more faulty cells. For the replacement managing function illustrated in FIGS. 4A-4D, data units are steered around faulty cells by shifting to the right. For example, referring to FIG. 4A, during a verify process, a data unit, such as bit 200 of 512 bits of a memory block 400, may have a value indicating that the cell 401 storing the data unit is faulty. If the cell 401 is not already at a value for self-identifying as a faulty cell, the cell 401 may be driven to a value in a range for a state that self-identifies as a faulty cell. As part of a subsequent or simultaneous step, a replacement function may be carried out by shifting (402) the data from the cell 401 to the right, resulting in each data unit to the right of the cell 401 to be shifted to the right and the last data unit (bit 0 for a single level cell implementation) to be shifted (403) into the first replacement cell R1.

During a read operation, because cell 401 self-identifies as a faulty cell, the data unit, such as bit 200 or multiple bits including bit 200, is obtained from the cell to the right of the cell 401 (with each consecutive data unit read from the right through to the first replacement cell R1).

Figure 4A:
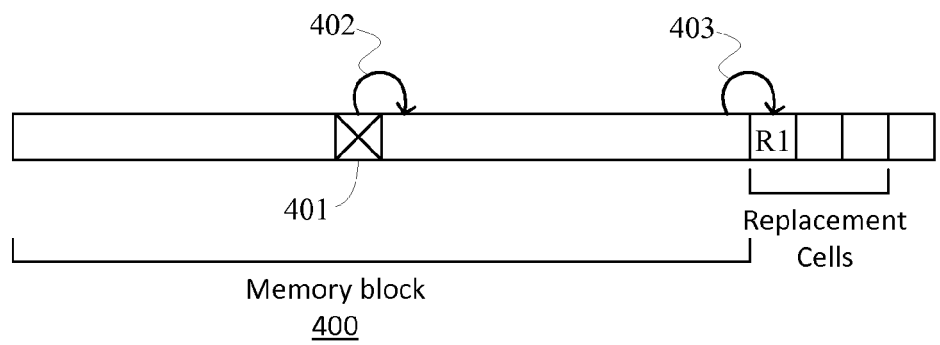
FIGS. 4A-4D illustrate one technique for writing to a location having one or more faulty cells.
Figure 4B:
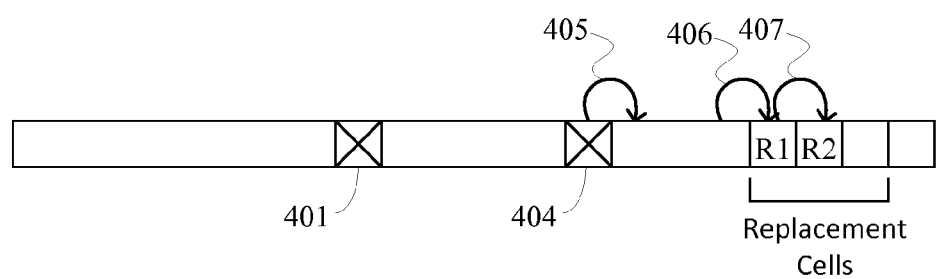

FIG. 4B shows a subsequent verify process in which another cell goes bad. As shown in FIG. 4B, bit 100 of memory block 400 may have a value indicating that the cell 404 is faulty. If the cell 404 is not already at a value for self-identifying as a faulty cell, the cell 404 may be driven to a value in a range for a state that self-identifies as a faulty cell. Subsequently or simultaneously, as part of a replacement function, the data from the cell 404 is shifted (405) to the right, resulting in each bit to the right of the cell 404 to be shifted to the right. Since another cell has gone bad in memory block 400, a last data unit of the memory block 400 is shifted (406) into the first replacement cell R1 and the data unit containing bit 0 is shifted (407) from the first replacement cell R1 to the second replacement cell R2.

Because cells 401 and 404 self-identify as faulty cells, the data units are read from (and written to) the cells around the faulty cells.

Figure 4C:
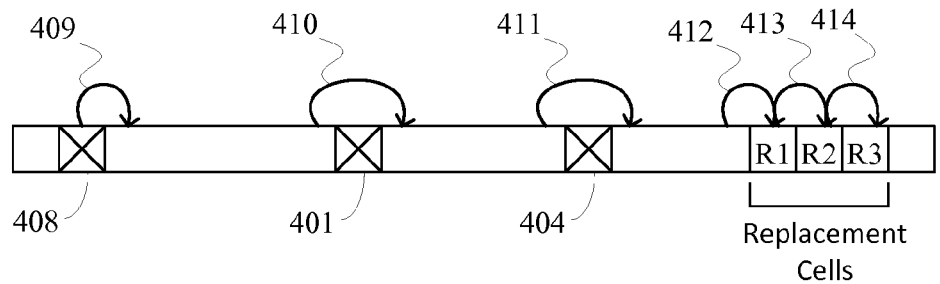

FIG. 4C shows a subsequent verify process in which another cell goes bad. As shown in FIG. 4C, a data unit, such as bit 500 or multiple bits including bit 500 of memory block 400, may have a value indicating that the cell 408 is faulty. If the cell 408 is not already at a value for self-identifying as a faulty cell, the cell 408 may be driven to a value in a range for a state that self-identifies as a faulty cell. Then, as part of a replacement function, the data from the cell 408 is shifted (409) to the right, resulting in each bit to the right of the cell 408 to be shifted to the right.

Because two cells (cell 401 and cell 404) self-identify as faulty cells in the memory block 400, data units shifting to the right steer around the self-identified bad cells. For example, one data unit (due to cell 408) steers around (410) cell 401 and two data units (due to the shifting from cell 408 and cell 401) steer around (411) cell 404. This shift to the right shifts (412) yet another data unit of the memory block 400 into the first replacement cell R1, the previously shifted data unit is shifted (413) from the first replacement cell R1 to the second replacement cell R2, and the data unit containing bit 0 is shifted (414) from the second replacement cell R2 to the third replacement cell R3.

Because cells 408, 401 and 404 self-identify as faulty cells, the data units are read from (and written to) the cells around the faulty cells, with the least significant data units (e.g., bit 0, bit 1, and bit 2 for a single level cell configuration) shifted to three replacement cells R1, R2, R3.

Thus, if the faulty cells 408, 401 and 404 are single level cells storing bits 500, 250, and 100, then the bits 0-2 are shifted into the replacement cell locations R1, R2, R3.

Figure 4D:
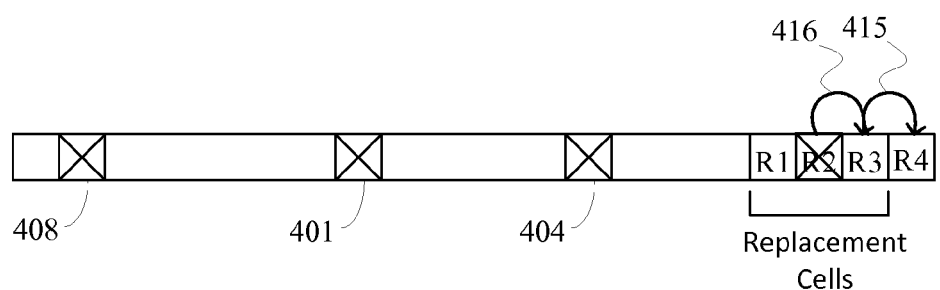

FIG. 4D illustrates a scenario in which a replacement cell fails. According to one implementation, data units can be shifted to the right to steer around the self-identified bad cell(s) of the replacement cells. For example, if replacement cell location R2 fails, bit 0 can be shifted (415) to replacement cell location R4 and bit 1 can be shifted (416) to replacement cell location R3. As an example for a multilevel cell, bits 0 and 1 can be shifted to replacement cell location R4 and bits 2 and 3 can be shifted to replacement cell location R3. Subsequent failures in the memory block shift data units into the replacement cells while steering around the self-identified bad cell R2.

FIGS. 5A-5D illustrate another technique for writing to a location having one or more faulty cells. For the replacement managing function illustrated in FIGS. 5A-5D, faulty data is relocated to replacement cells according to a faulty data relocation function.

Figure 5A:
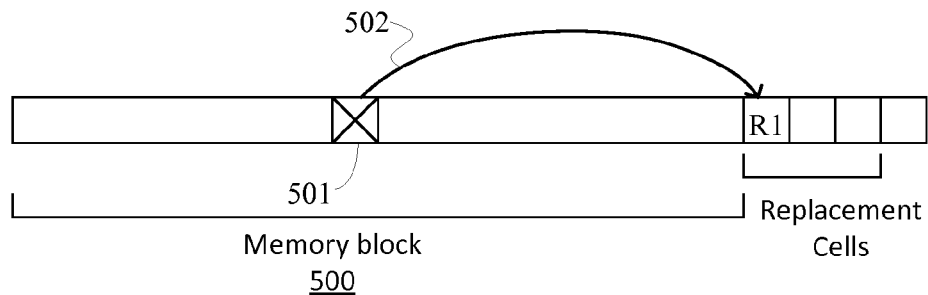
FIGS. 5A-5D illustrate another technique for writing to a location having one or more faulty cells.

Referring to FIG. 5A, during a verify process, a data unit, for example a data unit containing bit 200 of 512 bits of a memory block 500, may have a value indicating that the cell 501 storing the bit is faulty. If the cell 501 is not already at a value for self-identifying as a faulty cell, the cell 501 may be driven to a value in a range for a state that self-identifies as a faulty cell. Then, as part of a replacement function, the data from the cell 501 is relocated (502) to a first replacement cell R1.

Based on this example implementation, during a read operation, because cell 501 self-identifies as a faulty cell and is the first self-identified cell encountered from left to right, the data unit containing bit 200 is obtained from the first replacement cell R1. Bit 199 (or bits of an adjacent data unit) is read from the cell located next to cell 501.

Figure 5B:
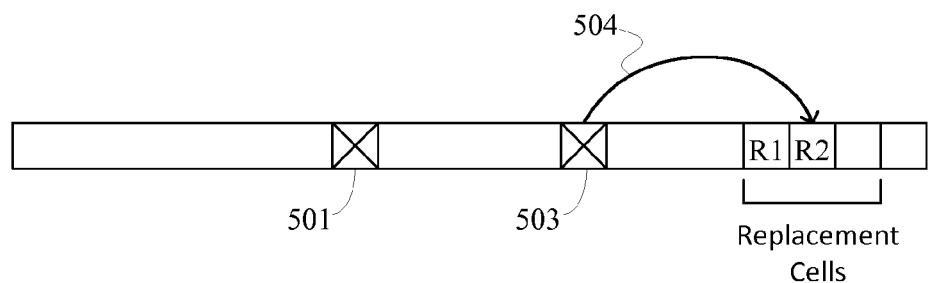

Then, referring to FIG. 5B, when a next cell 503 goes bad, the data from cell 503 is relocated (504) to a second replacement cell R2 because cell 503 is a second self-identified cell encountered from left to right.

According to this implementation, the replacement function maintains position order (left to right priority) for the replacement cells. Left to right priority is only one priority order that may be used. Other priority orders/ordering may be used, for example right to left priority. In yet other implementations, with the inclusion of pointers, ordering may be consecutive or following a particular pattern.

Figure 5C:
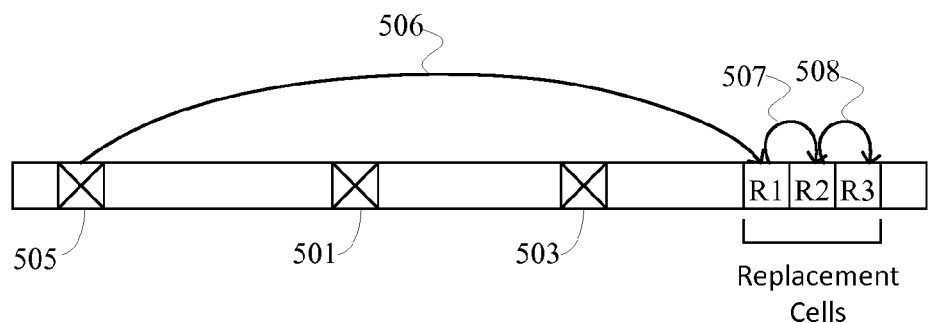

Replacement cells are re-written to maintain position order when chronological order of failure differs from position order. For example, as shown in FIG. 5C, if a cell 505 goes bad that is located to the left of other cells that have gone bad, the data in cell 505 is relocated to the first replacement cell 506 and the data from cell 501 and cell 503 in the replacement cells are reordered so that the data in the first replacement cell 506 can be moved (507) to the second replacement cell R2 and the data in the second replacement cell R2 can be moved (508) to the third replacement cell R3.

Thus, if the faulty cells 505, 501, and 503 are single level cells storing bits 500, 250, and 100, respectively, the values destined for these cells are instead stored in the replacement cells R1, R2, R3.

Figure 5D:
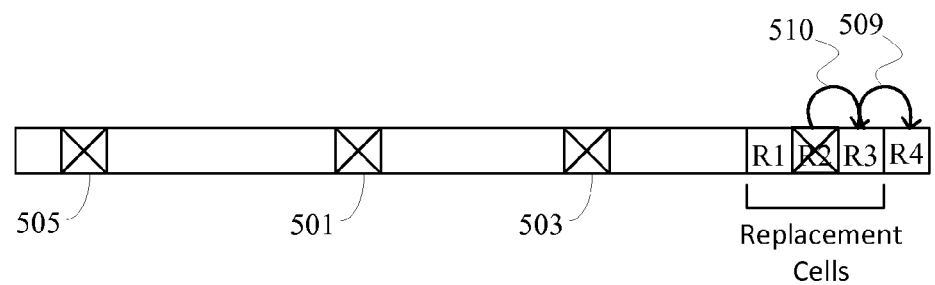

FIG. 5D illustrates a scenario in which a replacement cell fails. According to one implementation and similar to that described with respect to FIG. 4D, data units can be re-written to steer around the self-identified bad cell(s) of the replacement cells. For example, if replacement cell location R2 fails, bit 0 can be moved (509) to replacement cell location R4 and bit 1 can be moved (510) to replacement cell location R3. As an example for a multilevel cell, bits 0 and 1 can be shifted to replacement cell location R4 and bits 2 and 3 can be shifted to replacement cell location R3. Subsequent failures in the memory block shift bits into the replacement cells while steering around the self-identified bad cell R2.

In another implementation for addressing replacement cell failure, cell location R4 can be used to replace R2 since R2 is the last failed cell in the combined memory block and replacement cell group. Thus, R1 replaces faulty cell 505, R2 replaces 501 but is faulty, R3 replaces 503, and R4 replaces R2, therefore replacing 501.

Two predefined mappings are illustrated in FIGS. 4A-4D and 5A-5D. However, in some implementations, a programmatic remapping may be used. For example, a programmable controller can be used to map replacement data units by a hash function such as a hash function based on the address.

For implementations that utilize shifting as part of the replacement function, the entire memory block can be shifted to the right. This may be accomplished, at least in part, by logic on the memory device. For example, multiplexers (MUXs) may be used to push data left or right (keeping the data contiguous in memory in terms of layout).

For implementations that utilize a more direct replacement, such as where each replacement cell replaces a faulty cell, a left to right precedence may be included to facilitate how to assign the replacement cells back to the faulty location.

In another embodiment, the value originally to be written to a bad cell is written to a replacement cell as it is encountered. The replacement cells can be ordered (or re-ordered) by significance (e.g., most significant bit to least significant bit) upon encountering a bad cell (when a new cell fails, the replacement cells may be re-written to maintain corresponding position order—regardless of chronological failures).

To reduce the amount of shifting, a hybrid approach may be used. For example, a combination of shifting and replacement may be used. In one such case, a certain initial number of replacement cells may be configured to enable shifting and a remaining number of replacement cells may be configured for a replacement method. Memory arrangements as shown in FIGS. 3C and 3D may be suitable for the hybrid approach.

A reduction in the amount of shifting can also be carried out through a memory arrangement as shown in FIG. 3E, where a memory block can be divided into smaller groups of cells with their own replacement cells. Then, when a cell becomes faulty within one of the sub-blocks, the shifting can be maintained within the group. Other sub-block's replacement cells (and even the cells in other sub-blocks of the memory block) may be used for overflow of faulty cells according to any suitable cell replacement function including shifting and replacement. Thus, while replacement cells may initially be assigned for use with a memory sub-block, multiple sub-blocks may share the replacement cells as needed until there are no available replacement cells for the entire memory block.

As opposed to traditional error correction for stuck-at locations where the identification of bad cells was only available immediately after write operations, certain implementations enable quick and easy identification of which memory cells have stuck-at locations on read operations. Furthermore, because a cell can self-identify as being faulty in a manner as described herein, additional storage is not necessary to keep track of the faulty cells, reducing storage overhead as compared to traditional error correction techniques.

In some implementations, the memory is phase change memory (PCM); however, other memory, such as conductive bridging memories (e.g., programmable metallization cell (PMC)) and even DRAM (e.g., double data rate synchronous dynamic random access memory (DDR SDRAM)) can be configured to self-identify faults and utilize replacement memory cells as described herein. In addition, implementations are applicable for single level cells (cells that contain two valid states, such as 0, 1) and multi-level cells (e.g., cells that are programmed to contain more than two states, such as 00, 01, 10, 11).

In PCM, cells may break due to thermal stress. For example, the heater element (typically a conductive material to which current is applied) of a PCM that is used to control the resistance of the phase change material of the PCM cell may become detached. Without a heater element, no current is able to be applied and the cell becomes stuck at a high resistance value (which may be a value above the value range used to indicate a 1). Even where the heater element does not become detached, the heater element material may degrade to an extent where it becomes difficult to heat up the cell to increase its resistance. In those cases, the cell may become stuck at a low resistance value within a range indicating a 0.

According to an implementation, the PCM memory cell having either of these faults can durably self-identify that the cell is faulty. The self-identification can be accomplished by the high resistance value level (defined to be above the range generally used to indicate a 1) or by setting the cell to a lowest resistance value (a value in a range below that used to indicate a 0). Thus, either of these two states can be recognized as a fault during a read operation (either as part of a read process when reading data from memory or as part of a read-write-verify process used to write data to memory).

The mechanism by which the "stuck-at" information is made available to a read is based on cell failure modes. For PCM, when a cell gets stuck because of delamination (i.e., the heater separates from the cell), the resistance is much higher than in an amorphous state, so it is easily detectable on a read. The failure mode for a stuck at low state can occur because the cell circuitry is unable to deliver a large enough pulse to make the material amorphous. However, it is still possible to deliver a pulse of low amplitude (and long duration) that almost fully crystalizes the cell. This most crystalline state is used to signal that this cell has failed; so on a read the cell failure is detected.

A PCM cell can self-identify as bad by being at a value indicative of a bad cell. Two value ranges may be used so that if either of the two value ranges is encountered, the cell is understood to be bad. For PCM, a failure mode is probe/heater delamination. In this case the cell resistance value is "infinite." Another failure mode is probe degradation. In this case, the probe cannot provide enough current to change the cell into the amorphous state. Although the cell is not able to change to the amorphous state, the cell can be read and set into a crystalline state. It should be understood that while two failure modes are described, other states and associated failure modes are possible.

In addition, the self-identifying worn cells can be used as part of an integrated drift and stuck-at correction mechanism for multilevel cells.

For DRAM, instead of encoding locations of the faulty bits, the faulty bits can be destroyed by a laser process or by burning a fuse that can force a bit to be stuck at a certain value. In some cases, a fuse may be used to render a whole block, a partial block, or even a single cell depending on the fuse fabrication design.

In one implementation, a memory device includes a 512 cell PCM block with 64 cells for correction (based on the standard DRAM 12.5% overhead) with differential write capabilities. A differential write capability refers to a write process where the block is read and only the cells that are different are written. During the read portion of this write process, it is possible to know which cells are bad based on the additional states available from the self-identifying fault cells. Thus only good cells are written to and, for the shifting replacement cell logic implementation, data is shifted to the right to map around the stuck-at cells. This provides 64 cells for correction, an order of magnitude higher than some current techniques using pointers. Each spare cell can be used for replacement.

For decode, a reverse process can be used. When a block is read, the block is composed by shifting the data back to the right to build the 512-bit block in a register.

To implement the shifting replacement cell (or "bit steering") approach at the memory device level, for example on the PCM module, a 576-bit (512+64 bits) left/right shifter can be incorporated to respectively facilitate decode/encode. The left/right shifter can provide independent control of each bit such that selected bits can be shifted while others remain in place.

It should be understood that the size (64 cells) of the replacement cell block is merely provided as an example. Implementations may use different numbers of spare cells.

Figure 6:
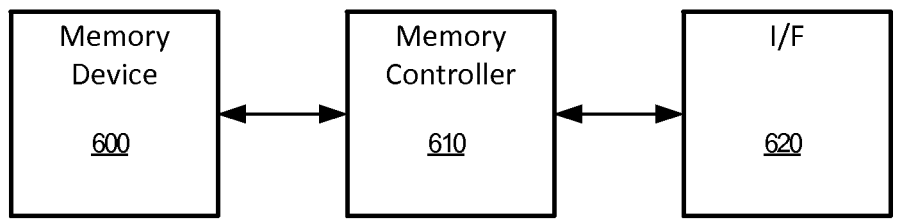
FIG. 6 is a block diagram of a memory system according to an example implementation.

FIG. 6 is a block diagram of a memory system according to an example implementation. Referring to FIG. 6, a memory system can include a memory device (or memory module) 600 and a memory controller 610 that can control overall input/output operations of the memory device. An interface 630 may be included for communicating with external devices such as a processor. The memory device 600 may be implemented as illustrated in FIG. 7.

Figure 7:
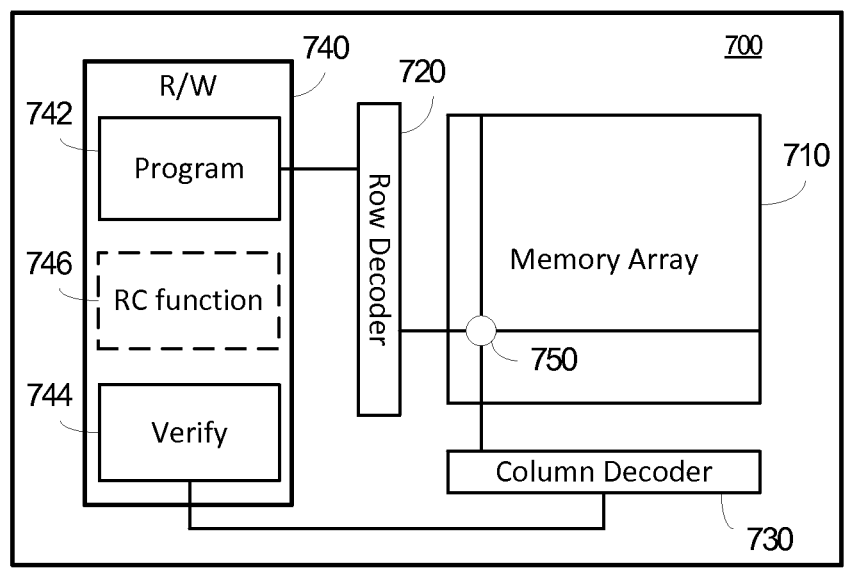
FIG. 7 is a block diagram of a memory device according to an example implementation.

In the example shown in FIG. 7, a memory device 700, such as a phase change memory device, may include a memory cell array 710 arranged in rows and columns. A row decoder 720 and a column decoder 730 are coupled to a read/write unit 740, which includes a programming circuit 742 and a verify circuit 744, as well as replacement cell logic (RC function) 746. A memory cell 750 may be selectable through the rows of word lines and columns of bit lines The bit steering can be implemented at the memory controller or memory module. To implement the method at the memory controller, the error locations are determined in order to encode the data. On reads, no additional data is necessary to perform the left shifts.

Many computing systems incorporate some form of error checking and/or correction. A common hardware solution is error correcting code memory, which includes extra memory bits and an on-board memory controller that can correct isolated soft memory errors by checking for memory parity and then correcting a single bit error to output the corrected data. In some cases 8 bits may be added to the 64 bits described above as part of the replacement cells to perform single error correction, double error detection (SECDED).

In more detail, in some cases, a memory controller can include features available for DDR error correction, such as a separate channel for error correction. The normal error channel can be used to correct soft errors and the storage for the error channel (normally used for soft errors) can be used to correct permanent or durable errors. These techniques can correct more errors and provide an optimal encoding for cell failures.

Figure 8:
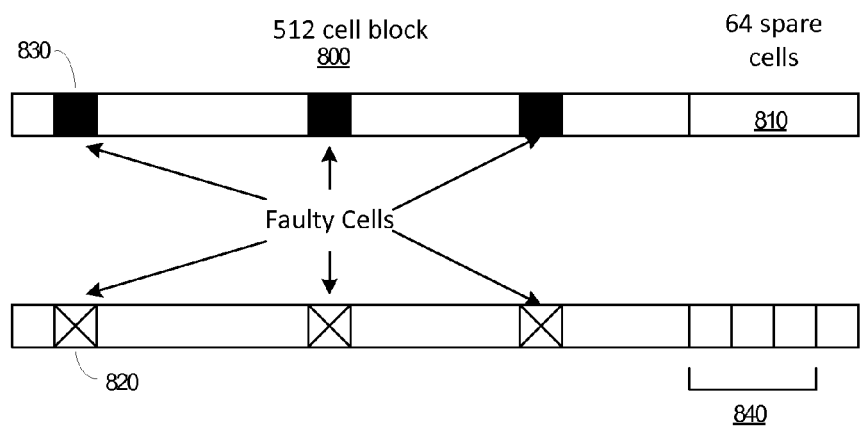
FIG. 8 illustrates an example controller handling of faulty cell regions.

In the memory controller, once the faulty cells are known, the error channel can be used to perform shifting or a replacement cell method. Since there is a risk of introducing soft errors when transiting from controller to module, some soft error correction techniques may be included. The faulty bits may be provided in the form of a vector of faulty cells received back from memory. The vector indicates where the faulty bits are located. Then, as illustrated in FIG. 8, the data is written into the memory having the 512-cell block 800 and 64 spare cells 810 via the encoding (e.g., skipping faulty cell—such as by shifting—or replacement into a corresponding number 840 of the spare cells) and have "don't cares" 820 in the three positions of the faulty cell blocks 830. In this implementation, because the soft error correction channel may be used to write the data into memory, there may be no or fewer bits available to perform soft error encoding.

If this is implemented in the PCM module, the memory channel correction part (e.g., the 64 bits/cells) can be used to protect against soft errors across the channel—between the memory controller and PCM module.

In some cases, the control of writing to/reading from replacement cells can have some components carried out at the memory module. In one such implementation, the normal channel from error correction (e.g., the bit per byte used for error correction) may be received from the controller. For example, the controller can perform the ECC for soft error resilience. Then, the memory module can take the information about where the bad bits are, discard the ECC bits from the controller, and perform the shifting replacement or mapping function. For example, the 512 block of bits can be received and the values originally to be written to any bad cells can be mapped to the replacement cells.

That is, according to an implementation, the bits in a memory bus corresponding to the replacement cells (or otherwise spare cells) may be used for ECC for soft errors such as due to transit/transient errors of the data. Then, at the controller the soft error correction may be discarded and the shifts/mapping performed.

Figure 9:
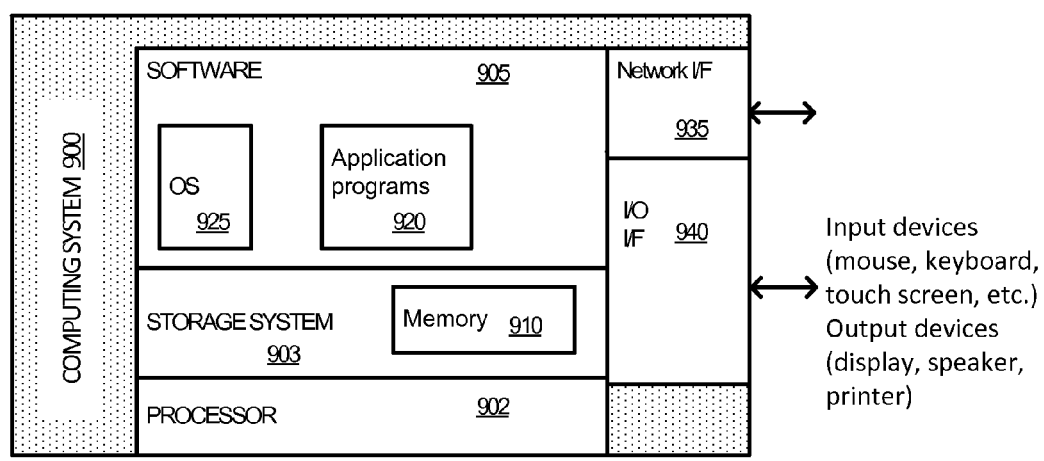
FIG. 9 is a block diagram illustrating components of a computing system in which certain implementations of the memory having durable self-identifying faults may be incorporated.

FIG. 9 is a block diagram illustrating components of a computing system in which certain implementations of the memory having durable self-identifying faults may be incorporated. It should be understood that aspects of the system described herein are applicable to both mobile and traditional desktop computers, as well as server computers and other computer systems.

Referring to FIG. 9, a computing system 900 can include a processor 902 and a storage system 903.

Processor 902 may include a microprocessor and other circuitry that retrieves and executes software 905 (including application programs (920) and/or an operating system 925) from storage system 903. The storage system 903 can store software 905 well as data generated during the execution of these programs. Processor 902 may be implemented within a single processing device but may also be distributed across multiple processing devices or sub-systems that cooperate in executing program instructions. Examples of processor 902 include general purpose central processing units, application specific processors, and logic devices, as well as any other type of processing device, combinations, or variations thereof.

In some cases, the processor 902 may be, or is included in, a system-on-chip (SoC) along with one or more other components such as sensors (e.g., magnetometer, an ambient light sensor, a proximity sensor, an accelerometer, a gyroscope, a Global Positioning System sensor, temperature sensor, shock sensor) and/or network connectivity components (e.g., including network interface 935).

Storage system 903 may comprise any computer readable storage media readable by processor 902 and capable of storing software 905. Storage system 903 may include volatile and nonvolatile, removable and non-removable media implemented in any method or technology, and according to various implementations includes at least one memory 910 having durable self-identifying faults, for storage of information, such as computer readable instructions, data structures, program modules, or other data.

Examples of storage media include random access memory (including RAM, DRAM, DDR SDRAM, SRAM); read only memory (ROM, PROM, EPROM, EEPROM); flash memory (NVRAM); magnetic and ferromagnetic/ferroelectric memories (MRAM, FeRAM); resistive memories and memristors (resistive random-access memory (ReRAM), PCM, CBRAM); magnetic disks; optical disks; virtual memory and non-virtual memory, magnetic cassettes, magnetic tape, magnetic disk storage or other magnetic storage devices, or any other suitable storage media. In no case is the storage media a propagated signal.

In addition to storage media, in some implementations, storage system 903 may also include communication media over which software 905 may be communicated internally or externally. Storage system 903 may be implemented as a single storage device but may also be implemented across multiple storage devices or sub-systems co-located or distributed relative to each other. Storage system 903 may include additional elements, such as a controller, capable of communicating with processor 902.

Software 905 may include additional processes, programs, or components. Software 905 may also comprise firmware or some other form of machine-readable processing instructions executable by processor 902.

In general, software 905 may, when loaded into processor 902 and executed, transform computing system 900 overall from a general-purpose computing system into a special-purpose computing system. Indeed, encoding software 905 on storage system 903 may transform the physical structure of storage system 903. The specific transformation of the physical structure may depend on various factors in different implementations of this description. Examples of such factors may include, but are not limited to the technology used to implement the storage media of storage system 903 and whether the computer-storage media are characterized as primary or secondary storage.

For example, if the computer-storage media are implemented as semiconductor-based memory, software 905 may transform the physical state of the semiconductor memory when the program is encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate this discussion.

A network interface 935 allows the computing system 900 to communicate with other computing devices, including server computing devices and client devices, over a network. The network interface 935 can include a unit to perform the function of transmitting and receiving radio frequency communications to facilitate wireless connectivity between the system and the "outside world," via a communications carrier or service provider. Transmissions to and from the network interface 935 are conducted under control of the operating system 925, which disseminates communications received by the network interface 935 to the application programs 920 and vice versa.

The computer architecture also may include an input/output controller 940 for receiving and processing input from a number of devices, including a keyboard, touchpad, touchscreen mouse, electronic stylus, pen, or microphone. Similarly, the input/output controller 940 may provide output to a display screen, a printer, speakers, or other type of output device).

In some embodiments, the display and the keypad are combined. In some embodiments two or more input/output (I/O) components including an audio interface and a video interface may be combined. Discrete processors may be included with the I/O components or processing functionality may be built-in to the processor 902.

It should be understood that any mobile or desktop computing device implementing system described with respect to FIG. 9 may have more or fewer features or functionality than described and is not limited to the configurations described herein.

Certain techniques set forth herein may be described in the general context of computer-executable instructions, such as program modules, executed by one or more computing devices. Generally, program modules include routines, programs, objects, components, and data structures that perform particular tasks or implement particular abstract data types.

Embodiments may be implemented as a computer process, a computing system, or as an article of manufacture, such as a computer program product or computer-readable medium. Certain methods and processes described herein can be embodied as code and/or data, which may be stored on one or more computer-readable media. Certain embodiments of the invention contemplate the use of a machine in the form of a computer system within which a set of instructions, when executed, can cause the system to perform any one or more of the methodologies discussed above. Certain computer program products may be one or more computer-readable storage media readable by a computer system and encoding a computer program of instructions for executing a computer process.

In addition, the methods and processes described herein can be implemented in hardware modules. For example, the hardware modules can include, but are not limited to, application-specific integrated circuit (ASIC) chips, field programmable gate arrays (FPGAs), and other programmable logic devices now known or later developed. When the hardware modules are activated, the hardware modules perform the methods and processes included within the hardware modules.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

It should be understood that the examples and embodiments described herein are for illustrative purposes only and that various modifications or changes in light thereof will be suggested to persons skilled in the art and are to be included within the spirit and purview of this application.

What is claimed is:

1. A self-identifying error memory device, comprising:
a plurality of memory cells arranged as memory blocks, each memory cell comprising:
at least two valid states, a first durable fault state, and a second durable fault state,
wherein the at least two valid states have values that fall within an upper boundary and a lower boundary,
wherein the first durable fault state has a value that is persisted outside the values of the at least two valid states such that, during normal operation, a reading of the value for the first durable fault state self-identifies that memory cell as being faulty, and
wherein the cell in second durable fault state has a value different than that of the first durable fault state but that is also persisted outside the values of the at least two valid states such that a reading of the value for the first durable fault state or the second durable fault state self-identifies that memory cell as being faulty.

2. The device of claim 1, further comprising:
a replacement cell block of replacement memory cells.

3. The device of claim 2, further comprising:
replacement cell function logic coupled to a programming circuit of the plurality of memory cells.

4. The device of claim 3, wherein the replacement cell function logic is configured to shift bits in a priority order while steering around any cells that self-identify as faulty.

5. The device of claim 3, wherein the replacement cell function logic is configured to use the replacement memory cells to store bits in place of cells that self-identify as faulty.

6. The device of claim 3, wherein the replacement cell block comprises a first set of replacement memory cells and a second set of replacement memory cells,
wherein the replacement cell function logic is configured to use the first set of replacement memory cells for shifting bits in a priority order while steering around any cells that self-identify as faulty; and use the second set of replacement memory cells to store bits in place of cells that self-identify as faulty.

7. The device of claim 2, wherein each memory block or sub-block of each memory block has a corresponding replacement cell block.

8. The device of claim 2, wherein the replacement cell block is shared by two or more memory blocks.

9. The device of claim 1, wherein the plurality of memory cells comprises single level cells having two valid states.

10. The device of claim 1, wherein the plurality of memory cells comprises multi-level cells having at least two valid states.

11. The device of claim 1, wherein a memory cell determined to have an error is driven to the fault state in order for the memory cell to self-identify as being faulty upon subsequent reading of the memory cell.

12. A memory device comprising:
a memory block comprising a region having one or more memory cells, wherein each memory cell of the one or more memory cells comprises at least two valid states, a first durable fault state, and a second durable fault state, wherein the at least two valid states have values that fall within an upper boundary and a lower boundary, wherein the first durable fault state has a value that is persisted outside the values of the at least two valid states such that, during normal operation, a reading of the value for the durable fault state self-identifies that memory cell as being faulty, and wherein the cell in second durable fault state has a value different than that of the first durable fault state but that is also persisted outside the values of the at least two valid states such that a reading of the value for the first durable fault state or the second durable fault state self-identifies that memory cell as being faulty; and
a first set of replacement cells associated with the memory block or a sub-block of the memory block, the first set of replacement cells having a first managing function controlling use thereof.

13. The memory device of claim 12, wherein the managing function comprises a shifting function.

14. The memory device of claim 12, wherein the managing function comprises a faulty data relocation function.

15. The memory device of claim 12, further comprising a second set of replacement cells associated with the memory block and having a second managing function controlling use thereof, the second managing function being different than the first managing function.

16. The memory device according to claim 12, wherein the region having one or more memory cells has a single memory cell.

17. The memory device according to claim 12, comprising phase change memory.

18. The memory device according to claim 12, wherein a memory cell determined to have an error is driven to the fault state in order for the memory cell to self-identify as being faulty upon subsequent reading of the memory cell.

* * * * *